(12) United States Patent
Tabatabaei et al.

(10) Patent No.: US 7,519,888 B2
(45) Date of Patent: Apr. 14, 2009

(54) INPUT-OUTPUT DEVICE TESTING

(75) Inventors: Sassan Tabatabaei, Sunnyvale, CA (US); Yervant Zorian, Santa Clara, CA (US)

(73) Assignee: Virage Logic Corporation, Fremont, CA (US)

( * ) Notice: Subject to any disclaimer, the term of this patent is extended or adjusted under 35 U.S.C. 154(b) by 425 days.

(21) Appl. No.: 11/499,829

(22) Filed: Aug. 4, 2006

(65) Prior Publication Data

US 2007/0079200 A1    Apr. 5, 2007

Related U.S. Application Data

(60) Provisional application No. 60/716,386, filed on Sep. 12, 2005.

(51) Int. Cl.
*G01R 31/28* (2006.01)

(52) U.S. Cl. .................... 714/733; 324/763

(58) Field of Classification Search ............ 324/537, 324/765, 763; 713/322; 714/724, 733
See application file for complete search history.

(56) References Cited

U.S. PATENT DOCUMENTS

| | | | |
|---|---|---|---|
| 5,062,122 A | 10/1991 | Pham et al. | |
| 5,101,153 A * | 3/1992 | Morong, III | ............ 324/537 |
| 5,670,890 A | 9/1997 | Colwell et al. | |
| 5,915,105 A | 6/1999 | Farmwald et al. | |
| 5,954,804 A | 9/1999 | Farmwald et al. | |
| 5,995,443 A | 11/1999 | Farmwald et al. | |
| 6,011,732 A | 1/2000 | Harrison et al. | |
| 6,032,214 A | 2/2000 | Farmwald et al. | |
| 6,035,365 A | 3/2000 | Farmwald et al. | |
| 6,044,426 A | 3/2000 | Farmwald et al. | |
| 6,049,846 A | 4/2000 | Farmwald et al. | |
| 6,085,284 A | 7/2000 | Farmwald et al. | |
| 6,100,735 A | 8/2000 | Lu | |
| 6,101,152 A | 8/2000 | Farmwald et al. | |
| 6,107,826 A | 8/2000 | Young et al. | |
| 6,173,432 B1 | 1/2001 | Harrison | |
| 6,260,263 B1 | 7/2001 | Haase | |
| 6,262,585 B1 | 7/2001 | Frodsham et al. | |
| 6,348,811 B1 | 2/2002 | Haycock et al. | |
| 6,348,826 B1 | 2/2002 | Mooney et al. | |
| 6,397,361 B1 | 5/2002 | Saitoh | |
| 6,421,801 B1 | 7/2002 | Maddux et al. | |
| 6,425,097 B1 | 7/2002 | Elachkar et al. | |
| 6,429,715 B1 | 8/2002 | Bapat et al. | |

(Continued)

OTHER PUBLICATIONS

Non-Final Office Action for U.S. Appl. No. 11/340,147 mailed Sep. 26, 2007, 7 pages.

(Continued)

*Primary Examiner*—David Ton
(74) *Attorney, Agent, or Firm*—Rutan & Tucker, LLP

(57) ABSTRACT

Integrated circuit test circuits may include at least an instruction processor and input-output subsystems. Input-output subsystems are segmented together into input-output subsystem segments. Each input-output subsystem includes an analog wrapper circuit (IW-A) operable to connect an input-output port to analog buses and further operable to isolate the input-output port from the buses, an integrated wrapper for delay test circuit (IW-D) operable to control a delay test sequence, and a soft wrapper circuit operable to control the IW-A and the IW-D, the soft wrapper circuit being directed by the instruction processor.

21 Claims, 9 Drawing Sheets

U.S. PATENT DOCUMENTS

| | | | |
|---|---|---|---|
| 6,445,231 | B1 | 9/2002 | Baker et al. |
| 6,449,738 | B1 | 9/2002 | Hinedi et al. |
| 6,452,432 | B2 | 9/2002 | Kim |
| 6,476,652 | B1 | 11/2002 | Lee et al. |
| 6,477,674 | B1 | 11/2002 | Bates et al. |
| 6,483,360 | B2 | 11/2002 | Nakamura |
| 6,486,919 | B1 | 11/2002 | Kim |
| 6,492,798 | B2 | 12/2002 | Sunter |
| 6,492,851 | B2 | 12/2002 | Watarai |
| 6,502,050 | B1 | 12/2002 | Chan |
| 6,580,304 | B1 | 6/2003 | Rieven |
| 6,586,921 | B1 | 7/2003 | Sunter |
| 6,629,274 | B1 | 9/2003 | Tripp et al. |
| 6,639,426 | B2 | 10/2003 | Haycock et al. |
| 6,657,936 | B2 | 12/2003 | Harvey et al. |
| 6,671,847 | B1 | 12/2003 | Chao et al. |
| 6,691,269 | B2 | 2/2004 | Sunter |
| 6,694,441 | B1 * | 2/2004 | Sethia ............ 713/322 |
| 6,731,128 | B2 | 5/2004 | Das et al. |
| 6,750,688 | B2 | 6/2004 | Takai |
| 6,754,613 | B2 | 6/2004 | Tabatabaei et al. |
| 6,760,873 | B1 | 7/2004 | Hao et al. |
| 6,774,694 | B1 | 8/2004 | Stern et al. |
| 6,777,995 | B1 | 8/2004 | Harrison |
| 6,839,860 | B2 | 1/2005 | Lin |
| 6,857,080 | B1 | 2/2005 | Liang |
| 6,865,135 | B2 | 3/2005 | Choi |
| 6,900,679 | B2 | 5/2005 | Watarai |
| 6,914,852 | B2 | 7/2005 | Choi |
| 6,934,215 | B2 | 8/2005 | Chung et al. |
| 7,032,145 | B1 * | 4/2006 | Burlison ............ 714/724 |
| 7,161,397 | B2 | 1/2007 | Lee et al. |
| 7,199,625 | B1 | 4/2007 | Chung |
| 7,202,719 | B2 | 4/2007 | Gabato et al. |
| 7,254,729 | B2 | 8/2007 | Matsushima et al. |
| 2001/0024135 | A1 | 9/2001 | Harrison |
| 2001/0026183 | A1 | 10/2001 | Kim |
| 2001/0035784 | A1 | 11/2001 | Watarai |
| 2002/0015460 | A1 | 2/2002 | Bhullar et al. |
| 2002/0027461 | A1 | 3/2002 | Kusunoki |
| 2002/0036526 | A1 | 3/2002 | Nakamura |
| 2002/0041196 | A1 | 4/2002 | Demone et al. |
| 2002/0057624 | A1 | 5/2002 | Manning |
| 2002/0153914 | A1 | 10/2002 | Arabi et al. |
| 2002/0154723 | A1 | 10/2002 | Nakamura |
| 2002/0157031 | A1 | 10/2002 | Lin |
| 2003/0001638 | A1 | 1/2003 | Watarai |
| 2003/0005374 | A1 | 1/2003 | Fought et al. |
| 2003/0030461 | A1 | 2/2003 | Oberle et al. |
| 2003/0067333 | A1 | 4/2003 | Nakamura |
| 2003/0071606 | A1 | 4/2003 | Sunter |
| 2003/0099321 | A1 | 5/2003 | Juan et al. |
| 2003/0151433 | A1 | 8/2003 | Takai |
| 2003/0196153 | A1 | 10/2003 | Evans |
| 2003/0199262 | A1 | 10/2003 | Chung |
| 2003/0208708 | A1 | 11/2003 | Sunter |
| 2004/0027993 | A1 | 2/2004 | Ghiasi et al. |
| 2004/0051551 | A1 | 3/2004 | Sunter |
| 2004/0062121 | A1 | 4/2004 | Chung et al. |
| 2004/0098648 | A1 | 5/2004 | Sunter |
| 2004/0109464 | A1 | 6/2004 | Seo et al. |
| 2004/0119455 | A1 | 6/2004 | Sunter |
| 2004/0123197 | A1 | 6/2004 | Sunter |
| 2004/0153931 | A1 | 8/2004 | Cao Jun et al. |
| 2004/0179640 | A1 | 9/2004 | Jacob et al. |
| 2004/0196064 | A1 | 10/2004 | Garlepp et al. |
| 2004/0221197 | A1 | 11/2004 | Goyal et al. |
| 2004/0223571 | A1 | 11/2004 | Donnelly et al. |
| 2004/0246017 | A1 | 12/2004 | Arabi et al. |
| 2005/0007157 | A1 | 1/2005 | Harrison |
| 2005/0025190 | A1 | 2/2005 | Frisch |
| 2006/0132164 | A1 * | 6/2006 | Walker et al. ............ 324/765 |
| 2006/0132165 | A1 * | 6/2006 | Walker et al. ............ 324/765 |
| 2006/0279310 | A1 * | 12/2006 | Walker et al. ............ 324/765 |

OTHER PUBLICATIONS

Arkin, Brian, "Realizing a Production ATE Custom Processor and Timing IC Containing 400 Independent Low-Power and High-Linearity Timing Verniers," IEEE International Solid-State Circuits Conference, Feb. 2004.

Bonnett, David, "IEEE 1149.1 yields new standards," Test & Measurement World, http://www.reed-electronics.com/tmworld/article/CA202501.html, Apr. 2002.

Christiansen, Jorgen, "An Integrated High Resolution CMOS Timing Generator Based on an Array of Delay Locked Loops," IEEE Journal of Solid State Circuits, Jul. 1996, pp. 952-957, 31:7.

Gillis, Pamela, et al, "Delay Test of Chip I/Os Using LSSD Boundary Scan," IEEE International Test Conference, Aug. 1998, pp. 83-90, Paper 4.1.

Hwang, Chorng-Sii, et al, "A High-Precision Time-to-Digital Converter Using a Two-Level Conversion Scheme," IEEE Transactions on Nuclear Science, Aug. 2004, pp. 1349-1352, 51:4.

Kuo, Andy, et al, "Jitter Models and Measurement Methods for High-Speed Serial Interconnects," ITC International Test Conference, Feb. 2004, pp. 1295-1302, Paper 46.1.

Kuo, Andy, et al, "Crosstalk Bounded Uncorrelated Jitter (BUJ) for High-Speed Interconnects," IEEE Transactions on Instrumentation and Measurement, Oct. 2005, pp. 1800-1810, 54:5.

Mantyniemi, Antti, et al, "A High Resolution Digital CMOS Time-to-Digital Converter Based on Nested Delay Locked Loops," IEEE, 1999, pp. 537-540.

Nelson, Rick, "PCB test: nails or TAP?" http://www.reed-electronics.com/tmworld/article/CA239852.html, Sep. 2002.

Nelson, Ou, et al, "Jitter Models for Design and Test of Gbps-Speed Serial Interconnects," IEEE Design & Test of Computers, IEEE Design & Test of Computers, Jul.-Aug. 2004, pp. 302-313.

Ricchetti, Mike, "Preliminary Outline of the IEEE P1500 Scaleable Architecture for Testing Embedded Cores," IEEE P1500 Architecture Task Force, 1999.

Santos, Dinis M, et al, "A CMOS Delay Locked Loop and Sub-Nanosecond Time-to-Digital Converter Chip," 1996, pp. 289-291.

Sunter, Stephen K, et al, "Complete, Contactless I/O Testing—Reaching the Boundary in Minimizing Digital IC Testing Cost," ITC International Test Conference, Apr. 2002, pp. 446-455, Paper 16.2.

Tabatabaei, Sassan, et al, "Embedded Timing Analysis: A SoC Infrastructure," IEEE Design & Test of Computers, May-Jun. 2002, pp. 24-36.

Tabatabaei, Sassan, et al, "An Embedded Core for Sub-Picosecond Timing Measurements," ITC International Test Conference, Apr. 2002, pp. 129-137, Paper 5.3.

Tabatabaei, Sassan, et al, "Jitter Generation and Measurement for Test of Multi-Gbps Serial IO," ITC International Test Conference, Feb. 2004, pp. 1313-1321, Paper 46.3.

"Boundary-Scan Tuorial," Corelis, http://www.corelis.com/products/Boundary-Scan_Tutorial.htm.

"IEEE Standard for a Mixed-Signal Test Bus," The Institute of Electrical and Electronics Engineering, Inc., Mar. 2000, pp. i-vi and 1-78.

"IEEE Standard Test Access Port and Boundary-Scan Architecture," The Institute of Electrical and Electronics Engineering, Inc., 2001, pp. i-iv and 1-200.

"IEEE Standard for a Mixed-Signal Test Bus" Test Technology Technical Committee of IEEE Computer Society, IEEE std 1149.4, pp. i-vi and 1-78, Approved Jun. 26, 1999.

"Standard Testability Method for Embedded Core-Based Integrated Circuits", (Draaft), Test Technology Technical Committee of IEEE Computer Society, Standard IEEE 1500/D11, pp. i-vii and 1-131, Jan. 2005.

* cited by examiner (a)

(b)

INPUT-OUTPUT DEVICE TESTING

RELATED APPLICATIONS

This application claims priority to U.S. Provisional Patent Application No. 60/716,386, entitled VARIOUS METHODS AND APPARATUSES FOR INPUT-OUTPUT DESIGNS, filed on Sep. 12, 2005.

TECHNICAL FIELD

Aspects of embodiments of the invention described herein relate generally to electronic circuit testing. Some aspects more particularly relate to circuit design for self-test and repair of integrated circuits.

BACKGROUND

Before an integrated circuit (IC) may be used in an application, it is typically necessary to verify the proper functionality and timing of components within each input/output (I/O) circuit of the IC. Verifying the functionality of an IC is typically accomplished by placing the IC on an external tester, also known as an Automated Test Equipment (ATE), which may include multiple Parametric Test Units (PMUs). An external tester typically includes a tester channel for each I/O pin on the IC. Subsequently, each I/O buffer coupled to an I/O pin is tested for functionality, timing, performance, etc. However, there are often problems associated with testing an IC in this manner. One problem is that testing each I/O pin on an IC is often expensive due to test equipment costs. Another problem is that the speed of the test equipment is typically not fast enough to keep pace with the IC performance requirements. Moreover, many existing test equipment are not capable of testing high-speed source synchronous systems.

A second approach for testing ICs containing I/Os involves using characterization and performing limited testing with a tester. Some manufacturers of ICs characterize their I/Os and then later, when in production, test merely simple direct current (DC) parameters for selectively sampled I/Os. This approach has become increasingly insufficient due to large number of device pins and smaller geometries that lead to more defects in the I/Os.

A third approach for testing ICs containing I/Os involves using on-chip Design for Testing (DFT) and Built-In Self-Test (BIST). Some companies, typically Integrated Device Manufacturers (IDMs) and some larger fabless companies, use in-house approaches including DFT/BIST. Some approaches are comprehensive, but others are ad hoc and may be difficult to extend to new classes of I/Os and/or new process technologies. Further, using BIST for testing of digital chips provides superior yield and predictable performance. When timing tests, such as I/O timing tests, are to be performed on a device in embedded mode using mostly self-generated signals, it is particularly important that the circuitry provides good performance without large on-chip area demands such as may arise out of excessive circuit complexity.

IEEE 1149.1 (a standard from the Institute of Electrical and Electronic Engineers) is intended for testing of device interconnects, such as printed circuit board (PCB) testing. It is possible to use generic IEEE 1149.1 compliant digital boundary modules for communicating data with I/Os, but that can result in excessively extended test times, too large a tester vector memory requirement, and/or a need for significant on-chip memory such as to store intermediate test results. IEEE 1149.4 (a related IEEE standard) provides for automatic test of analog circuit subsystems but has several disadvantages and limitations. For example, it requires at least two external test point connections (pins) dedicated for testing, and continuous boundary buses. These requirements may be excessively burdensome.

SUMMARY

In one embodiment of the invention, an apparatus includes a plurality of input-output circuits (I/O), such that the plurality of I/Os are segmented together into at least a first I/O segment and a second I/O segment. The apparatus also includes a first analog bus to provide external access for test purposes to two or more pins that provide PMU functionality to the first I/O segment through two or more I/Os within the first I/O segment.

In another embodiment of the invention, Integrated circuit test circuits include testable input-output subsystems that are segmented together into input-output subsystem segments. Each input-output subsystem includes an analog wrapper circuit (IW-A), an integrated wrapper for delay test circuit (IW-D), and a soft wrapper circuit operable to control the IW-A and the IW-D.

Other aspects of the invention will be apparent from the accompanying figures and from the detailed description which follows.

BRIEF DESCRIPTION OF DRAWINGS

One or more embodiments of the invention are illustrated by way of example and not limitation in the figures of the accompanying drawings, in which like references indicate similar elements and in which.

DETAILED DESCRIPTION

In the following description, numerous specific details are set forth, such as examples of specific input output circuits, named components, connections, etc., in order to provide a thorough understanding of the present design. It will be apparent, however, to one skilled in the art that the present design may be practiced without these specific details. In other instances, well known components or methods have not been described in detail but rather in a block diagram in order to avoid unnecessarily obscuring the present design. Thus, the specific details set forth are merely exemplary. The specific details may be varied from and still be contemplated to be within the spirit and scope of the present design.

The design may provide testability and repair features for ICs containing I/Os. The design may provide a generalized test and repair solution for I/Os that may be packaged within manufactured devices. Using a Self-Test and Repair I/O System ("SIS"), a system on-a-chip ("SOC") with hundreds or even thousands of I/Os may be tested by using a tester that supports only a few tens of pins. SIS is a generalized test and repair solution for I/Os, and may be packaged with the I/O.

The design enables sequential access to the I/Os for analog, timing and digital data access. This provides access to all I/Os without causing routing congestions in the chip. Accordingly, analog access to digital I/O buffers is provided without adding dedicated I/Os to the chip, as could be required under IEEE 1149.4 standard. Further, an uninterrupted chain of testable I/Os is segmented together. Multiple on-chip analog buses are used to provide external access to the I/Os in a segmented I/O chain through at least two I/Os of the plurality of I/Os but less than all of the plurality of I/Os within the segment. These I/Os couples to an external tester that provides PMU functionality. The testable I/Os are bi-directional, in that they can send and receive data.

Strobes to the I/Os may be routed using buffers and two buses that form a ring around the chip, to avoid routing congestion. Additional calibration methods are provided that avoid loss of accuracy that can result from such routing strategy. Also, a central test processor controls all operations of SIS, generates test patterns and analyses the results.

Figure 1:
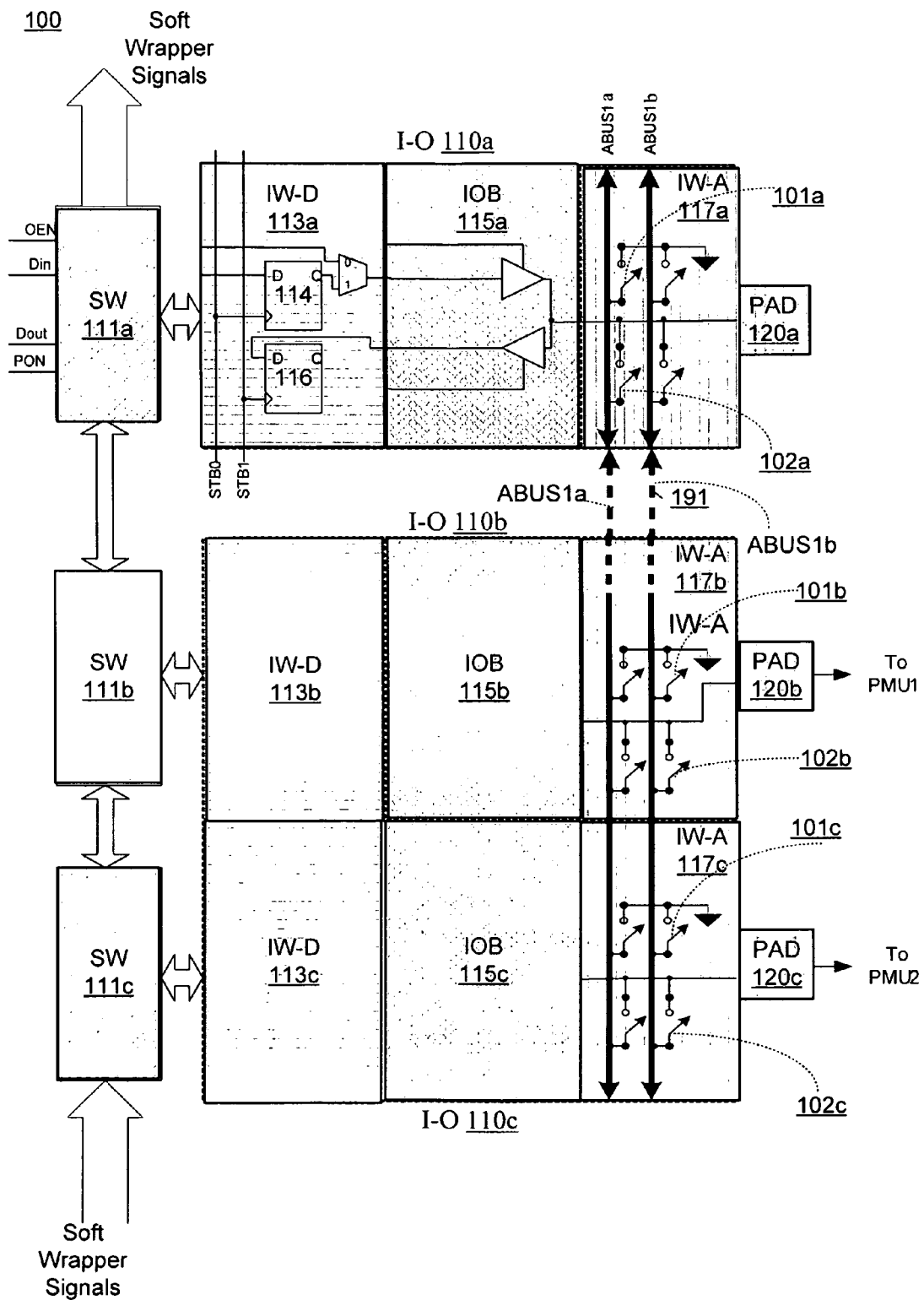
FIG. 1 illustrates a block diagram of an embodiment of one I/O chain segment including a series of wrappers.

FIG. 1 illustrates a block diagram of an embodiment of one I/O chain segment including a series of wrappers. I/O segment 100 includes an example number of I/Os 110a, 110b, and 110c. In many cases, an IC may contain groups of SIS-enabled I/Os and groups of I/Os that are not SIS-enabled, e.g., SERDES I/Os, I/Os without required SIS wrappers, and so on. In such cases, the I/Os may be segmented together. A segment is an uninterrupted chain of testable I/Os and/or a grouping of I/Os that possess similar input-output voltage characteristics. In a segmented I/O chain, multiple on-chip analog buses are used to provide external access to the I/Os through two I/Os or potentially more but less than all of the I/Os within the segment. In one embodiment, two I/Os from each segment may be connected to external PMUs to provide DC test access to all I/Os in that segment.

FIG. 1 shows how a series of I/Os are accessed sequentially for analog, timing test, and digital access. The analog access is provided by analog buses (ABUS1a and ABUS1b), the timing test access by strobe buses (STB0 and STB1), and digital access is made possible by soft wrappers (111a, 111b, and 111c) that are connected to their corresponding I/Os and the soft wrappers of the immediately adjacent I/Os. For instance, soft wrapper 111a is connected to its corresponding I/O 110a and to the soft wrapper 111b of the immediately adjacent I/Os 110b. The sequentially connected I/O wrappers perform all the logical and parametric tests. The design provides adequate access to I/Os for DC, timing, and logical test and measurements without causing routing congestion or requiring significant area overhead.

Each I/O is connected to a respective Pad 120. Typically, each Pad 120 may be formed by metallization (or otherwise) and may connect to an off-die circuit (not shown in FIG. 1) by means of a bond-wire, flip-chip solder bead, or other means as is well-known in the art.

As depicted, each I/O subsystem 110 comprises a corresponding soft wrapper circuit 111, an integrated wrapper for delay digital test (IW-D) circuit 113, an I/O buffer (IOB) 115, and an integrated wrapper for analog test (IW-A) 117.

The soft wrapper circuit 111 is an I/O wrapper, and may be delivered as soft macro or synthesizable soft core. An I/O wrapper is the circuitry dedicated to each I/O for test and debug operations. The soft wrapper 111 uses a boundary scan mechanism for exchanging test data with their respective I/O using modularity and reduced routing congestion features. In one embodiment, the soft wrapper circuit 111 includes a circuit similar to the digital boundary scan module used in IEEE1149.1 or IEEE1149.4 standards. In an alternate embodiment, the soft wrapper circuit 111 is delivered as hard macros within the I/O frame. A chain of I/O soft wrappers may serve as boundary scan modules for SIS enabled I/O. In one embodiment of the invention, the soft wrapper circuit 111 can support both the IW-A and the IW-D simultaneously. An embodiment of a soft wrapper is discussed in greater detail with reference to FIG. 4.

The IW-D circuit 113 is the integrated wrapper that is included in each I/O for delay and timing tests. In one embodiment, the IW-D circuit 113 includes launch and capture D-flip flops (114 and 116 respectively) operable to launch and detect transitions for a delay test sequence for each I/O in the I/O segment 100. Accordingly, the action of the IW-Ds 113 may be in support of conducting various types of delay test, including launch and capture response tests. The IW-Ds 113 may act to synchronize and select appropriate timing signals (STB0 and STB1) from strobe conductors. In one embodiment, the IW-D circuit 113 is hardened and included in the I/O frame due to timing critical paths and matching requirements. An embodiment of an IW-D is described below in reference to FIG. 6.

The IW-A circuit 117 is included in each I/O for DC and analog test access. In one embodiment, the IW-A circuit 117 is designed as a hard macro and is dependent on the structure and test needs of each I/O. For most bidirectional I/Os, the IW-A circuit 117 includes analog bus (ABUS) routings, which are designed such that they can be connected from one I/O to the next through abutment. These buses form two I/O ring routings. The buses provide electrical access to the I/O Pads 120. For DC parameter test, current and voltage are forced on the Pad 120 using one bus line (e.g., ABUS1a) and Pad voltage measured through the second line (e.g. ABUS1b). In an embodiment, the buses ABUS1a and ABUS1b carry analog signals for one I/O segment. Multiple segment may be used for different I/O voltage domains such as 1.8V, 2.2V 2.5V etc., present in the 10 chain. The two buses carrying analog signals ABUS1a and ABUS1b in the first I/O segment 10a are not connected to the two buses ABUS2a and ABUS2b carrying analog signals in a second I/O segment.

The segmented architecture illustrated in FIG. 1 is supported by analog bus to ground switches 101 in each IW-A. Accordingly, the IW-As 117 may comprise controlled switches 101a, 101b, 101c, 102a, 102b, and 102c, which may each operate under control of an associated soft wrapper 111. Such switches may be embodied as ordinary structures, such as FETs (field-effect transistors). The switches may connect the analog bus ABUS1a, ABUS1b to ground during normal operation that is when placed into application service as contrasted with when undergoing testing. The ground switches 102 are activated when not in analog test mode; accordingly the analog buses are set to ground when not in use, e.g., during a timing test or when in functional mode. This reduces noise associated with floating buses. Grounding an analog bus when unused (such as in normal application operation) may enhance noise immunity. Grounding for this purpose may be for radio frequency signals or more generally for alternating current (AC) signals and need not necessarily involve DC grounding.

Thus, each IW-A 117 has a switch the two analog buses ABUS1a and ABUS1b to ground. Accordingly, IW-A 117a has a first dual pole switch 102a to switch the two analog buses ABUS1a and ABUS1b to PAD in the first I/O 110a, IW-A 117b has a second dual pole switch 102b, which may switch the two analog buses ABUS1a and ABUS1b to the second I/O PAD, and so on.

The IW-A circuit 117 may also include PAD-to-ABUS switches to connect the I/O to the analog buses. These switches may have to be designed to maintain I/O Electrostatic discharge (ESD) protection level. The IW-A circuit 117 may also include ABUS-to-VSS voltage switches to connect the analog buses to the VSS to avoid floating buses when all other PAD-to-ABUS switches are open, e.g., in normal I/O function mode. As indicated by the solid lines in IW-A 117b and 117c, data signals may flow in either direction between Pad 120 and a respective IW-A 117. Analog signals may flow in either direction along analog bus which links the IW-As 117 together (e.g., in a "bus" circuit topology).

The IW-As 117 may act to connect the primary data path (and hence the Pad 120) to the analog bus, or to isolate it from that bus responsive to control signals received from the soft wrapper 111.

The analog bus ABUS1a may provide external access for test purposes to the single pad 120a that provides PMU functionality to test the first I/O segment 110a through two or more I/O circuits within the I/O segment 100. Switches 102b and 102c in two of the I/Os in the segment, may each serve to connect one selected conductor of the analog bus ABUS1a, ABUS1b to two Pads 120b and 120c and thence to a corresponding off-die (off-chip) circuit, for example PMU1, PMU2. Circuits PMU1, PMU2 may typically be connected to an external instrument or test gear, for example a PMU. In this way external test circuit access to conductors of the analog bus may be provided, without having dedicated test pins. In this way, two PMUs may connect to each I/O segment that contains large amounts of individual I/Os via two general-purpose I/Os.

Thus it is possible to use an external PMU to impress signals, via the analog bus, upon a circuit under test and/or to make measurements of test results such as for characterizing IOBs (and possibly other circuits).

In an embodiment, IOBs 115 comprises current drivers and receiver circuits. An I-OB 115 may be controlled by a corresponding soft wrapper 111. For example, a soft wrapper 111 may enable either a receiver or a driver at any particular moment.

The segmented analog bus architecture illustrated in FIG. 1 enables I/Os to be tested, even when there may be I/Os on a chip that are not SIS-enabled. This makes it possible to place I/Os with SIS on chips containing non-SIS I/Os. Further, while typically more analog buses would be needed in a single chain architecture to accommodate multiple I/O voltage domains, merely two analog bus lines and four switches in the SIS integrated wrapper are required, regardless of the number of I/O voltage domains. Segmented architecture allows limiting the analog bus length and loading by splitting long chains into smaller chains. This reduces the amount of space required on the chip for the analog buses, and further enables controlled trade-off between the number of tester pin connections and the test time and accuracy. Further, each I/O segment may be tested in parallel, which improves the speed of testing.

The embedded features of SIS may include modification to I/O soft wrapper subsystems that control test features. Further, special techniques may result in a reduced number of clock cycles being needed to communicate test data with I/Os. This may significantly accelerate tests, sometimes in the range of one or two orders of magnitude relative to using IEEE-1149.1-conforming digital boundary modules. Further, intelligent re-use of soft wrapper registers may reduce the need for on-chip memories such as for saving intermediate test results. Also, the SIS embedded test feature set may be a key enabler in facilitating retained use of low-cost and/or legacy tester(s) thereby reducing test and/or repair costs.

External control of SIS and similar testing features may sometimes require relatively large tester vector memories. Embodiments of the invention may thus provide a series of techniques and methods to resolve or at least mitigate test time and/or tester memory requirements. Several advantages to purchasers and users of devices embodying the invention may be provided. The methods and systems described herein reduce costs associated with testing, enable accurate tests, including timing tests, and provide repair opportunities to improve yields. Accordingly, the methods and circuits described herein may have a superior price and/or performance over previously developed solutions. Moreover, it may be possible to realize devices having superior performance using fewer circuit components and/or less critical component tolerances thus improving reliability, yield and/or providing still further advantages.

Embodiments of the invention enable reduced pin-count testing. Using SIS, a SOC with hundreds or thousands of I/Os may be tested by a tester that supports only a few tens of pins. This allows testing high pin count chips on older testers that support small number of pins. Further, the reduced pin count testing may allow testing more than one chip on a tester simultaneously. This may further reduce the test cost and/or time.

Further, according to an embodiment of the invention, cell libraries and compilers for self test and repair of one or more I/Os are added.

Figure 2:
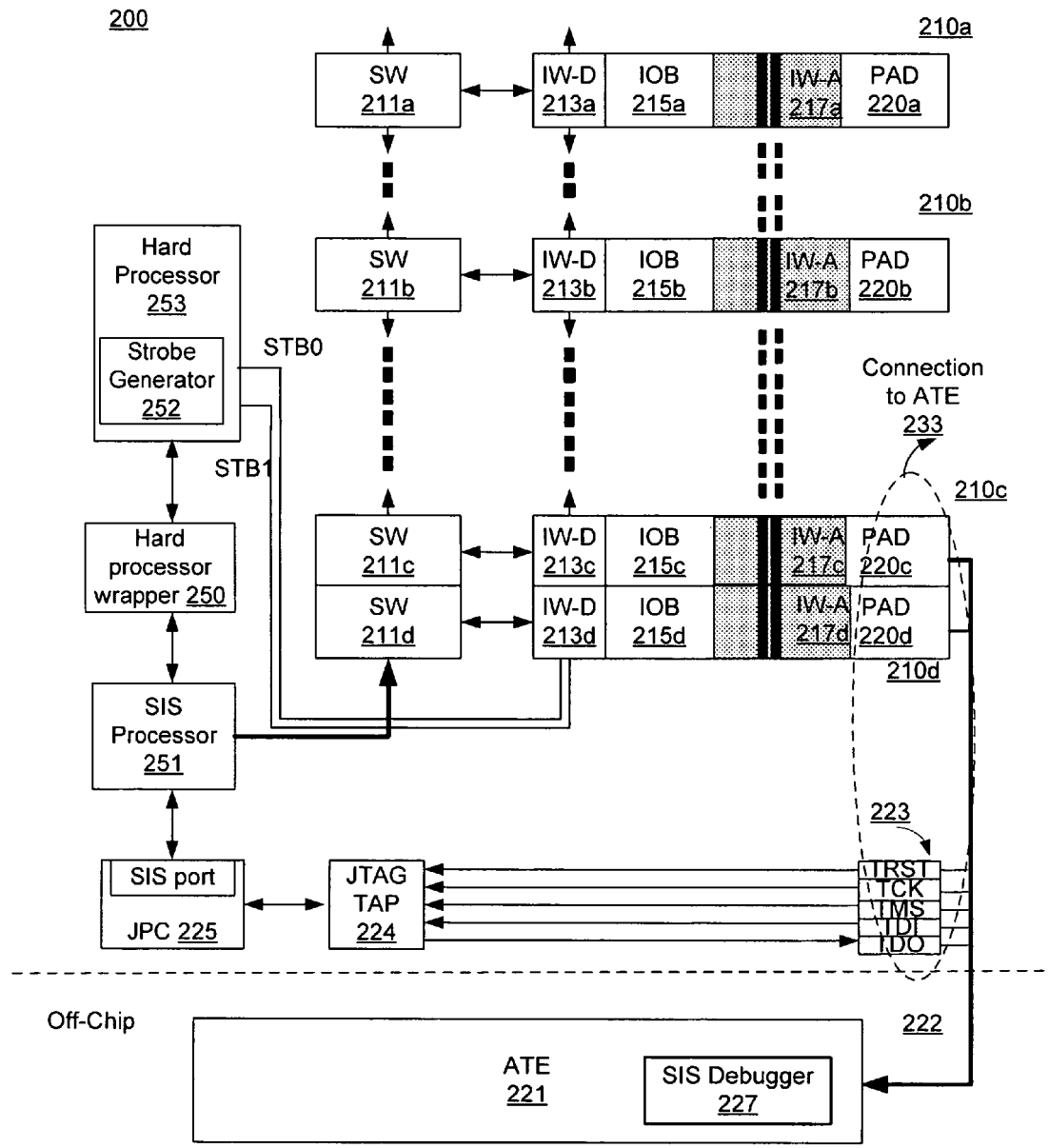
FIG. 2 illustrates a block diagram of an embodiment of a representation of Self-Test and Repair I/O System ("SIS") architecture.

FIG. 2 illustrates a block diagram of an embodiment of a representation of a Self-Test and Repair I/O System ("SIS") architecture that is used to support I/O segments. FIG. 2 illustrates one I/O segment and other on-chip and off-chip components. The SIS 200 includes multiple on-chip and off-chip infrastructure IP components to perform different I/O related test and diagnostic components. The SIS on-chip components include multiple I/O segment (only one shown in FIG. 2), the I/O segment including multiple testable I/Os that are segmented together. For purposes of illustration, four testable I/Os 210a, 210b, 210c, and 210d are shown in FIG. 2. As discussed in reference to FIG. 1, each testable I/O 210 further includes a soft wrapper 211, an integrated wrapper for delay digital test (IW-D) circuit 213, an I/O buffer (IOB) 215, and an integrated wrapper for analog test (IW-A) 217. The SIS on-chip components also include a hard processor 253, a hard processor wrapper 250, and a soft processor 251.

In the embodiment shown in FIG. 2, the on-chip SIS circuitry is connected to an external automated test instrument 221 via a connection path 222 and connector 233. The connector 233 may provide two analog connections to Bonding Pads 220 and a JTAG (IEEE-1194.1 compatible) block 223 supporting circuits TRST, TCK, TMS, TDI and TDO as defined in IEEE-1194.1 standard. A JTAG Test Access Port (TAP) state machine 224 may also be provided. The JTAG TAP 224 may provide boundary scan capabilities compatible with IEEE 1194.1, as well as other features.

A soft processor 251 is the main instruction processor, and may be delivered as a soft macro. Thus, the ATE 221 has external communication access to the soft processor 251, such as for control, status and data exchange purposes. The soft processor 251 may also generate the control signal(s) for various SIS components, including the hard processor wrapper 250 and I/O chain of soft wrappers (e.g., the chain including soft wrappers 211a, 211b, 211c, and 211d). The SIS processor 251 may control each and any of the soft wrappers 211 by impressing control signals on a boundary-scan control bus. The soft processor 251 may also generate test patterns for BIST operations, and receive and analyze test results for generating on-chip test signatures. The soft processor 251 connects via a JPC (JTAG Protocol Converter) 225 to communicate with the JTAG TAP 224 in order to exchange data with an off-chip tester 221. Thus, the soft processor 251 may direct the soft wrapper circuits 211a-221d as well as be a central instruction processor that controls all operations during testing, generates vector test patterns and analyzes results from the each I/O segment after the testing is applied. In the embodiment depicted, the hard processor 253 resides separately from the I/O subsystems and serves at least to support the control of the strobe generator 252. The hard processor wrapper 253 includes several registers that are addressed by the soft processor 251. These registers receive and/or generate data for the control of the hard processor 253. An embodiment of the hard processor 253 is discussed in greater detail below with reference to FIGS. 5A and 5B.

The soft wrappers 211 are directed and controlled by the action of the soft processor 251 to impress control signals on the extended boundary scan circuits. In turn each soft wrapper 211 may control a respective IW-D 213, IOB 215 and IW-A 217. In one embodiment, the Pads 220 are bonding Pads that are connectable to external test signals PMU1, PMU2 that may be dedicated to testing purposes. In other embodiments, ordinary (i.e. full featured) I/Os may be used to connect to the pads 220 and the external connector 223, as shown in FIG. 2.

A primary off-chip SIS component is the debugger 227. The debugger 227 is a software module that resides on the ATE 221 and functions to generate/receive the data vectors, and synchronize the PMU with the vectors for exercising different tests through JTAG TAP 224. Another off-chip SIS component is a builder (not shown). The builder is a software component that inserts SIS components on the chip.

Figure 3:
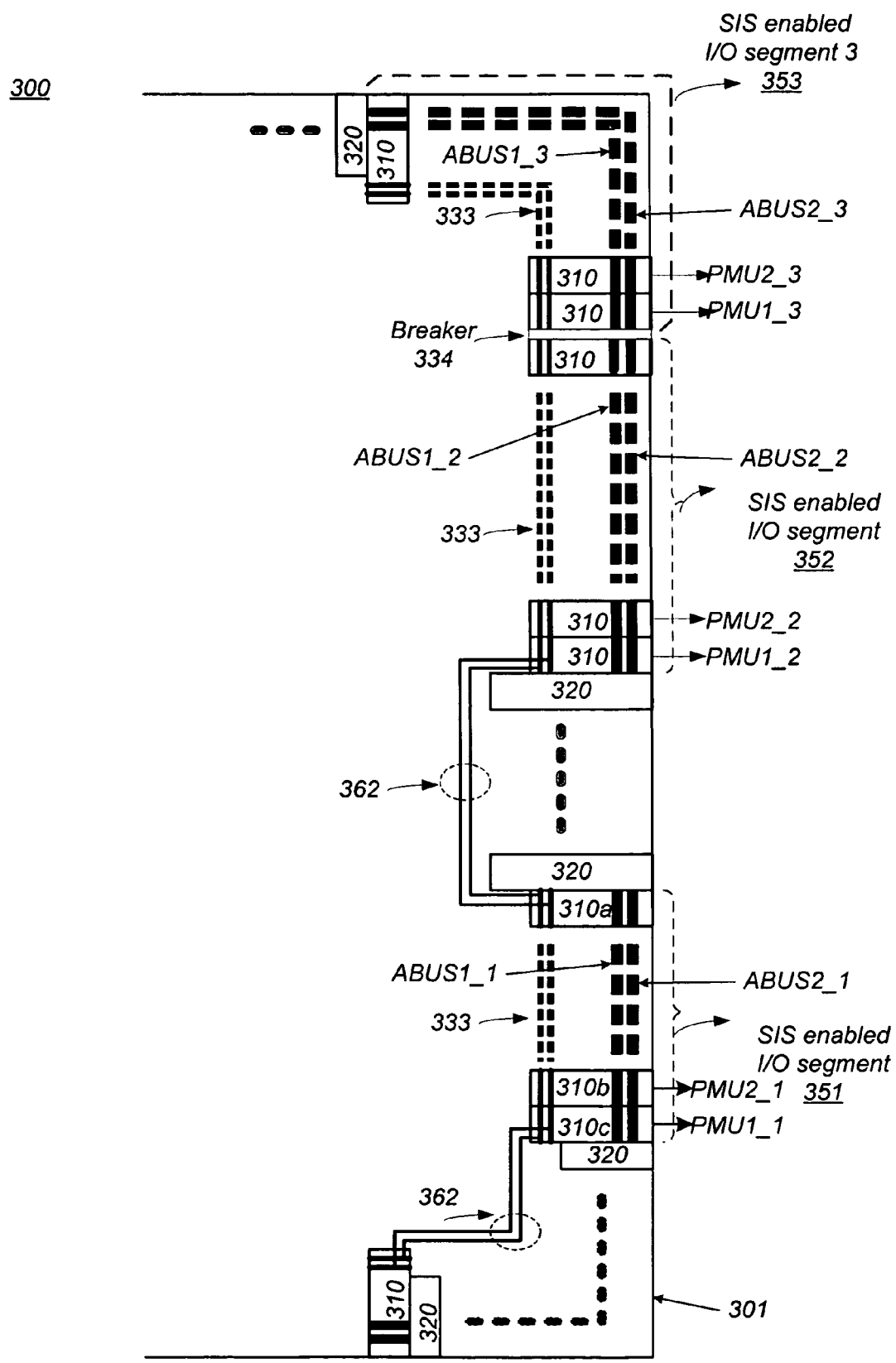
FIG. 3 illustrates a block diagram of an embodiment of a segmented I/O chain.

FIG. 3 illustrates a block diagram of an embodiment of a segmented I/O chain to allow test and repair features for SIS-enabled I/Os even if non SIS-enabled I/Os are present in between them. Accordingly, as shown in FIG. 3, I/Os are divided into segments of SIS-enabled I/Os that form a continuous chain. In each segment, any two I/Os may be connected to two external PMUs to provide analog access to all I/Os in that segment. The two I/Os used for test access are general purpose I/Os and need not be dedicated test pins for test purposes only.

In the embodiment depicted in FIG. 3, for purposes of illustration, three separate chain segments 351, 352, 353 are shown. Thus, the first I/O segment 351 is formed from a first continuous chain of I/Os. The second I/O segment 352 is formed from a second continuous chain of I/Os. The third I/O segment 353 is formed from a third continuous chain of I/Os. The SIS processor contains logic configured that may sequentially access the first I/O segment 351, then the second I/O segment 352, and then the third I/O segment 353 for analog testing, timing test and digital access. The SIS processor may also enable testing some I/O features in different segment in substantially parallel manner.

The I/O segment 351 includes SIS-conforming I/Os 310a, 310b, and 310c. The conforming I/Os 310a, 310b, 310c have digital interconnects and share analog buses ABUS1_1 and ABUS2_1. Multiple on-chip analog buses (ABUS 1, ABUS 2) are used to provide external access to the I/Os through two I/Os (e.g., 310b and 310c within segment 351) within the segment. The pecked lines 333 represent an indeterminate number of other (conforming) I/O subsystems with digital interconnects and analog buses ABUS1, ABUS2. The die 301 also includes non-conforming I/Os 320 that do not share the analog buses ABUS1, ABUS2, and may also not include other features that render them non-conforming. In SIS enabled I/O segment 351, the analog buses are ABUS 1_1 and ABUS 2_1, and the PMUs are PMU1_1 and PMU 2_1. In SIS enabled I/O segment 352, the analog buses are ABUS 1_2 and ABUS 2_2, and the PMUs are PMU1_2 and PMU 2_2. In SIS enabled I/O segment 353, the analog buses are ABUS 1_3 and ABUS 2_3, and the PMUs are PMU1_3 and PMU 2_3.

An analog bus provides electrical access to the I/O Pads. An IC may contain several I/O analog access buses, each corresponding to an I/O segment. As depicted in FIG. 3, for each I/O segment 351, 352, 353, it may be necessary to have a number of off-die connection pairs PMU1, PMU2. For instance, the analog buses ABUS1_1, ABUS2_1 are used to provide external access to the I/Os 310a, 310b, 310c of segment 351 through two I/Os (310b, 310c) within the segment 351. Accordingly, two PMUs (PMU1 and PMU2) access each bus through to selected I/O pins in each segment.

The I/O segments 351, 352, 353 may not be fully connected with one another. Although the analog bus conductors ABUS1_1/ABUS2_1 and ABUS1_2/ABUS2_2, and ABUS1_3/ABUS2_3 may, in some embodiments, usefully be routed to all the segments 351, 352, 353, in general they may be mutually isolated, for many (but not necessarily all) test signals. The ABUS1 and ABUS2 conductors may be connected in the I/O row or column through abutment within a segment. As discussed, between two segments, there is no connection between the ABUS1 and ABUS2 conductors.

Also, although segments may be divided by the placement of non-conforming I/O subsystems or other modules on the die periphery, it may also be desirable in some circumstances to introduce a segment breaker 314 between adjacent I/O subsystems 310 that do implement chaining for test purposes. Accordingly, some segments may be separated with a breaker cell to separate two I/O voltage domains. Other reasons for splitting one I/O segment into two or more segments, e.g., using a breaker, include avoiding long buses, reducing load, increasing test speed, and so on.

The strobe bus conductors 362 conduct strobe signals (e.g., for conducting a delay test) may, in some embodiment, be mutually isolated from one segment to others, in general they are routed to all segments. In one embodiment, the strobe signals are connected by abutment in one segment. Between two segments with a breaker I/O circuit (e.g., segments 352 and 353), the strobe bus conductors 362 may be connected using short routings between the two closets I/Os in the nearest domains. Between two segments with no breaker (e.g., segments 351 and 352), the strobe bus conductors 362 may be connected with abutment to the breaker cell that includes bus routings. The strobe bus conductors typically require less area to implement than clock tree architecture.

Figure 4:
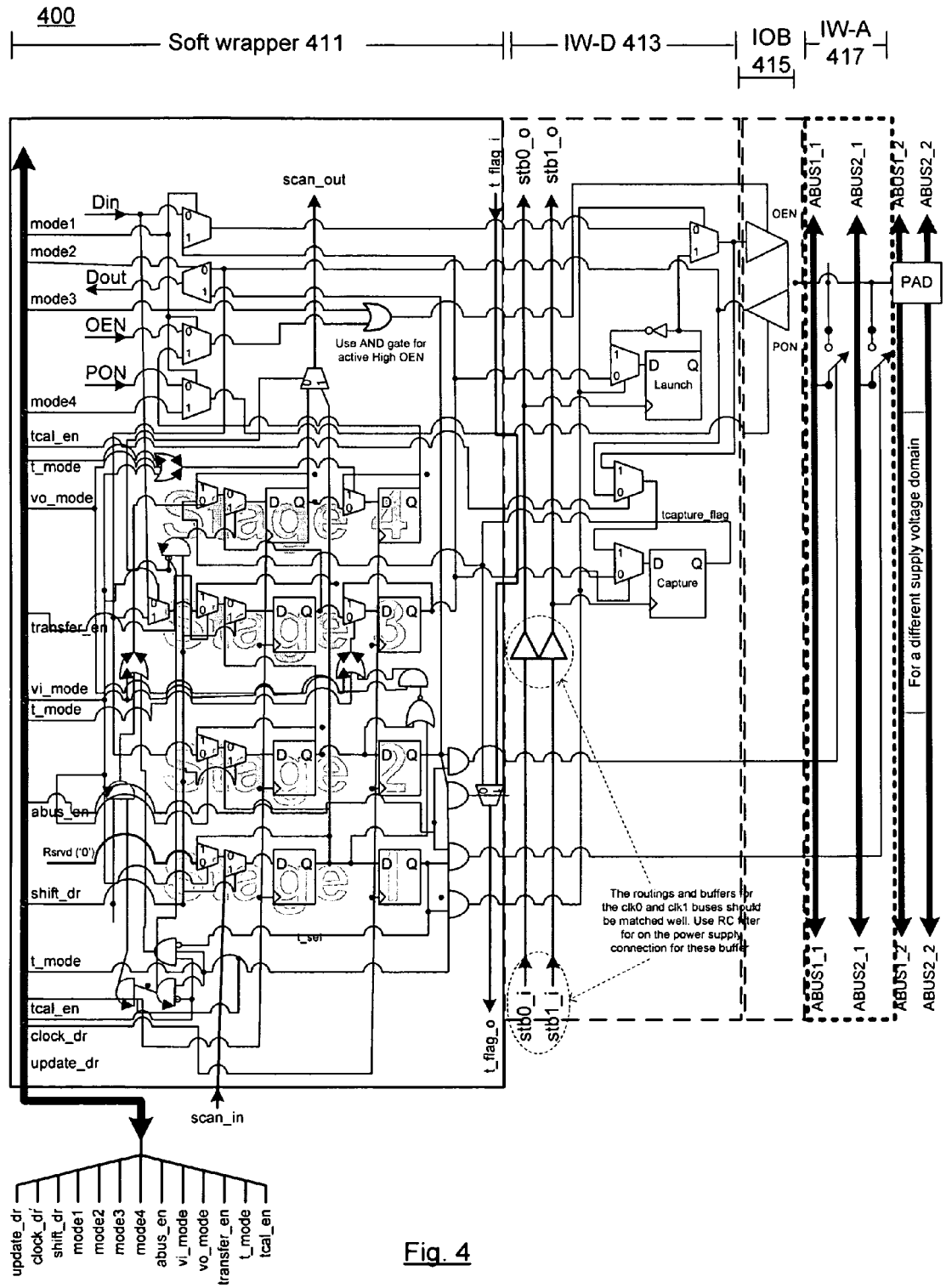
FIG. 4 illustrates a component level schematic diagram of an embodiment of an embedded logic enabled bidirectional I/O with wrappers for signal control and analog and delay test.

FIG. 4a illustrates a component level schematic diagram of an embodiment of an embedded logic enabled bidirectional I/O with wrappers for signal control and analog and delay test. The wrappers 411, 413, and 417 are the circuitry dedicated to each I/O for test and debug operations of SIS. The wrappers are designed specifically for each I/O type and support different measurements. The bi-directional wrappers in 400 include four major sub-modules: soft wrapper circuit 411, an IW-D circuit 413, and an IW-A circuit 417. As shown in FIG. 4, the wrappers in 400 include both the IW-D and the IW-A with the IOB. The IW-D and IW-A wrappers are separate, but co-exist and may be supported by the soft wrapper 411 simultaneously.

At the soft wrapper 411, control data comes via a pin and goes through multiple scan stages that capture the control and test signals. The soft wrapper 411 can supply signals to either the IW-A circuit 417, or the IW-D circuit 413, or to both the IW-A circuit 417 and IW-D circuit 413. Accordingly, the IW-A or IW-D may be eliminated in a design that does not need analog or delay test features, respectively. This may reduce area overhead.

The soft wrapper 411 includes MUXes for temporary test data storage. Accordingly, test data at each stage does not need to be shifted out of the soft wrapper immediately. Rather, test data at each stage may be stored in the temporary data storage in the soft wrapper, and be sequentially accessed at a later time. In one embodiment, the soft wrapper 411 supports hold operations on its eight registers. Selective activation of hold state of the registers in different modes of operation provides ability to implement multiple "partial update", "partial capture", and "partial shift" operations. These additional operations can be used by different SIS instructions to reduce test time.

The soft wrapper 411 includes a digital boundary scan module (DBM), with multiple shift/update stages. The DBM exchanges data with the SIS soft processor (251) for functional tests, delay tests, DC parametric measurements, and IEEE11494.1 standard compliance. The DBM provides boundary scan mechanism for exchanging test data with each I/O because of its modularity and reduced routing congestion features. The soft wrapper 411 is designed to comply with IEEE 1149.1 standard for enabling users to perform board level tests. The soft wrapper 411 supports all mandatory and optional instructions of IEEE1149.1 standard.

For functional tests, the DBM applies 0 or 1 to the I/O and captures I/O input receiver logic to check whether I/O can transfer the logic correctly. For delay tests, the DBM transfers initialization data to and captures the timing test flag from the timing test circuit in the IW-D. Examining the tcapture_flag indicates whether the I/O delay is more or less that a programmed delay specified by the strobe generator circuit. For DC parametric measurements, which involve the use of analog buses in IW-A for low frequency voltage and current test, the DBM controls the output buffer data, enable control input, and the analog switches in the IW-A to perform different measurements. The 10 receiver output is also captured by the DBM. For IEEE11494.1 standard compliance, three scan/update stages support all ten mandatory and optional public instructions of IEEE1149.1 standard for bidirectional 10. These instructions are: BYPASS, SAMPLE, PRELOAD, EXTEST, INTEST, RUNBIST, CLAMP, IDCODE, USERCODE, and HIGHZ.

Figure 5A:
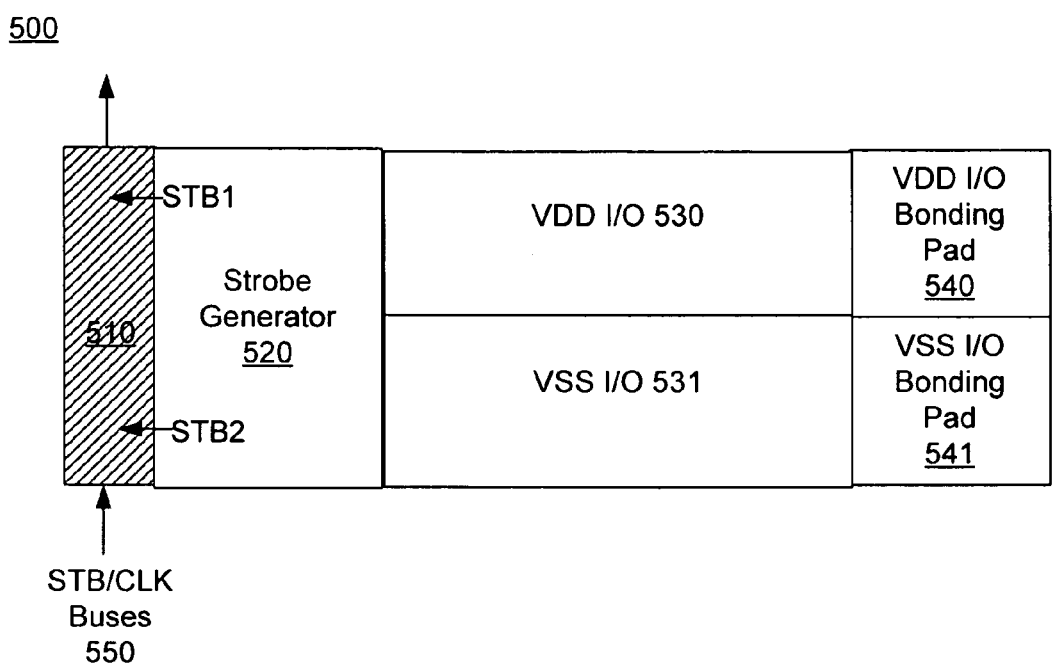
FIG. 5A illustrates a block diagram of an embodiment of a hard processor.

FIG. 5A illustrates a block diagram of an embodiment of a hard processor.

The hard processor 500 includes a strobe generation circuit 520. The strobe generation circuit 520 includes circuitry to generate strobe signals with precisely controlled delay between their transitions. In one embodiment, the strobe generation circuit 520 includes two or more delay-locked loops (DLLs) supplied with the same clock, but having the number of taps that are prime relative to each other, e.g., N and (N+1). This circuit 520 can also generate clock with programmable phase delay between them, which may be used for jitter measurement, if needed. The strobe signals are used for I/O buffer delay tests and measurement. The hard processor 500 may further include strobe distribution buses 550. Thus, the strobe generation circuit is operable to provide a set of timing signals to each IW-D of each I/O. The instruction processor directs the strobe generation circuit. The timing signals control the delay test sequence.

In one embodiment, the hard processor 500 includes two analog I/Os—VDD I/O 530 and VSS I/O 531. These I/Os are used to supply clean power supply to the strobe generation circuit 520. This helps to reduce noise in the strobe delays. These I/Os may have the same footprint as other I/Os in the library. These I/Os are added to each I/O library and have the same size as the rest of the I/Os in the library. Bonding Pads 540 and 541 are connected to the I/Os for access to a PMU, if needed. Other circuits may be added to the hard processor as other test needs arise from the additional I/O type added to the library.

In one embodiment, instead of using the analog I/Os—VDD I/O 530 and VSS I/O 531 to power up the rest of circuitry of the hard processor 500, the circuitry of the hard processor 500 may be connected directly to available on-chip power supplies.

Figure 5B:
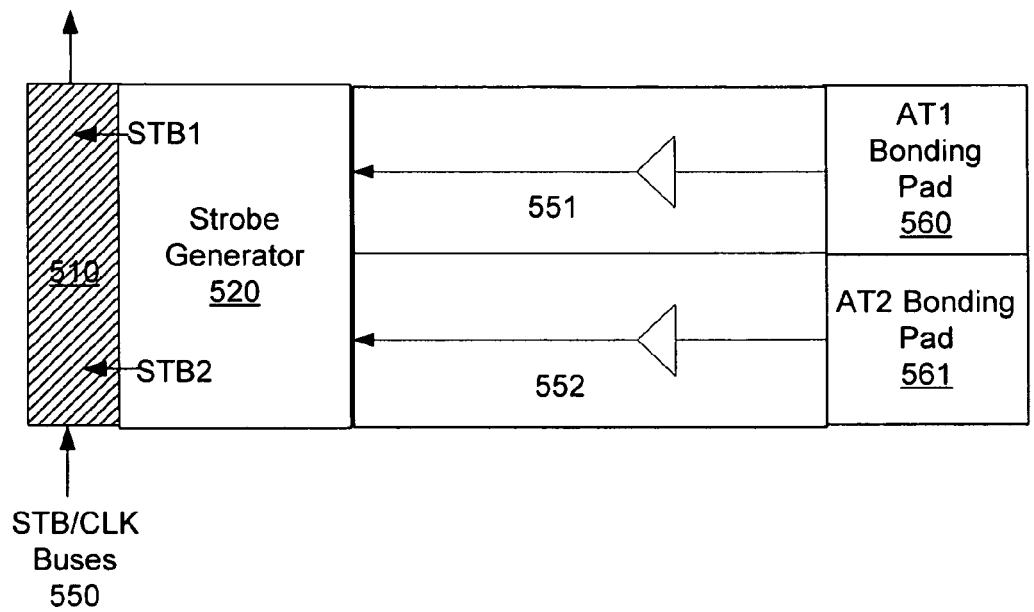
FIG. 5B illustrates an embodiment of hard processor that includes two receiver I/O buffers.

FIG. 5B illustrates an embodiment of hard processor that includes two receiver I/O buffers. The hard processor 590 has two receiver I/O buffers 551 and 552. The buffers 551 and 552 are used for receiving reference clock, or external strobe/clock signals.

Figure 6:
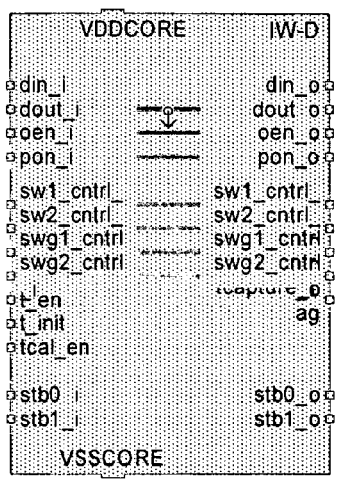
FIG. 6 illustrates a schematic diagram of an embodiment of an integrated wrapper for delay test.
Figure 6:
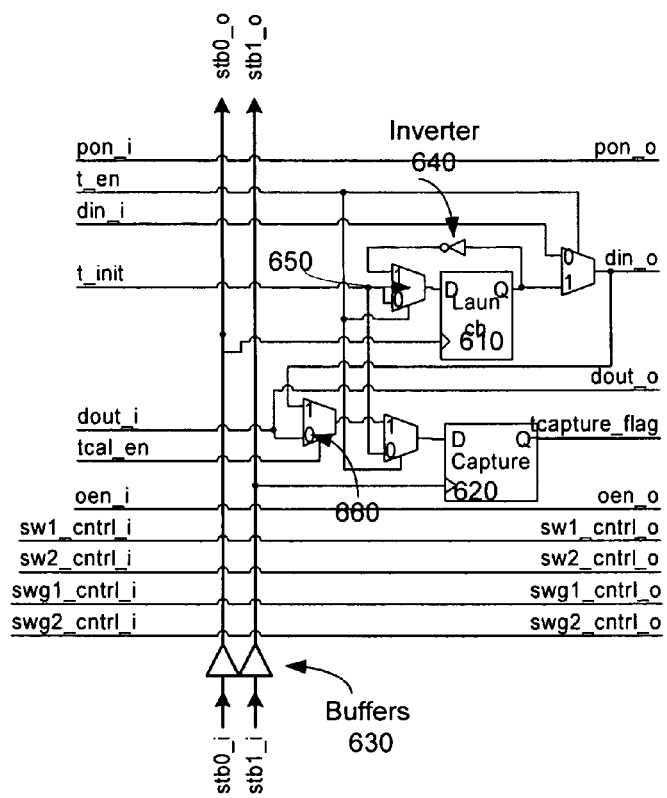

FIG. 6 illustrates a schematic diagram of an embodiment of an integrated wrapper for delay test (IW-D). Every I/O may be augmented with an IW-D 600. The IW-D 600 performs delay and timing test using sequential delay test technique. Typically, a clock signal is generated using a clock tree, but this usually takes a lot of space to implement and is somewhat difficult to generate reliably. Instead, as shown in FIG. 6, strobes are routed as buses.

The IW-D uses a toggle mode under soft wrapper control to generate launch signals in response to a first strobe. The IW-D is also operable to launch and detect transitions for a delay test sequence for each I/O in an I/O segment. In order to create a transition at the output of the Launch DFF 610, the IW-D 600 uses an inverter 640 and MUX 650 feeding back the Launch DFF output to its input. Transferring a 0 or 1 to its input through the I/O soft wrapper and activating one or more rising edges on the stb0 initializes the Launch DFF 610. Subsequently, select the input 1 of a feedback MUX 650 to turn the DFF 610 into a toggle flip-flop. Another rising edge is activated on the stb0 to generate a transition of the DFF 610 output. This method provides the flexibility to launch a programmable transition pattern on the different I/Os, while requiring merely one I/O soft wrapper shift. Further, because the initialization data is written merely once, test time is saved. Also, it is easier and faster to initialize the IW-D registers and perform testing of rising and falling edges.

For calibration, the Capture DFF 620 through three MUXes samples the output of the Launch DFF 610. This allows estimation of delays through the MUXes and DFFs and also residual delay error between the two strobe signals. This estimate later is used to eliminate these errors and calibrate the measurements. After the generation of the launch signal, the IW-D then captures a voltage response after a time interval selected by an instruction processor from a plurality of selectable time intervals.

Further, to solve problems associated with buffer mismatch and accumulated delays, especially over a long chain of I/Os that need to be tested, according to an embodiment of the invention, the IW-D includes a calibration loop that uses a launch flip flop and a capture flip flop to test an I/O wrap path delay. Accordingly, a Launch register 610 in the IW-D 600 launches a transition at the rising edge of the strobe stb0. This transition travels through the I/O wrap path, which includes output buffer and input receiver. The Capture register 620 captures the launch signal after going through the wrap path on the rising edge of the strobe stb1. The strobe stb1 is delayed relative to the strobe stb0 by a known amount referred to as "strobe delay". The stb0_i and stb1_i signals are generated by the strobe generation circuitry (e.g. 520) in the hard processor (e.g. 400). The capture result indicates whether the wrap path delay is more or less than strobe delay. This method can be used to test the wrap path delay against a known threshold for production applications, or estimate the wrap path delay by repeating the test for different values of strobe delay, which typically swept with high resolution within a given range. For instance, an I/O delay time may be determined using the calibration loop that includes the launch flip flop 610 and the capture flip flop 620. The I/O wrap path also includes a first multiplexer and a second multiplexer to switch transition travels through a first path through a first I/O and through a second path that bypasses the first I/O. The I/O delay time can be determined for a first I/O is determined by subtracting out the time for the second path from the time for the first path.

The strobe buffers 630 should be very well matched because the difference of delays between these elements results in measurement error. In one embodiment, a small RC power supply filters for these buffers is used to prevent accumulation of power-supply induced jitter. Doing so may improve measurement accuracy without repeating measurements, which would otherwise be needed to reduce the jitter/noise effects.

Figure 7:
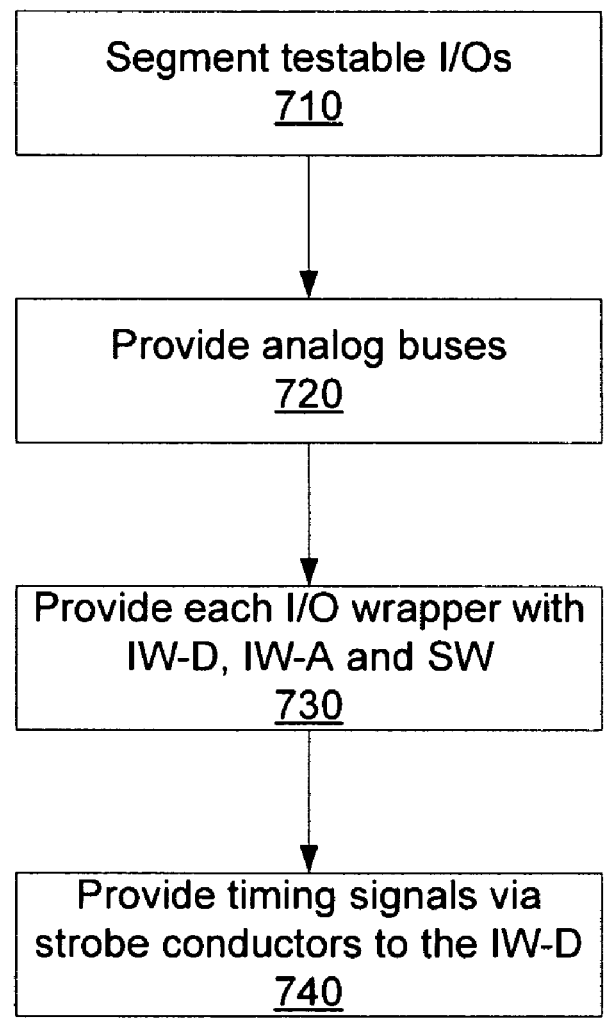
FIG. 7 illustrates an example of a process for generating a device according to an embodiment of the invention.

FIG. 7 illustrates an embodiment of a method to test an IC containing I/Os. At block 710, the I/Os are segmented into testable I/O chains. Segmenting I/Os enables I/Os to be tested, even when there may be I/Os on a chip that are not testable. Further, each I/O segment may be tested in parallel, which improves the speed of testing. At block 720, the analog bus (ABUS) routings are provided to provide electrical access to the I/O pads. The ABUS routings are grounded when the ABUSes are not in use. At block 730, each I/O wrapper is enhanced with an IW-A, an IW-D, and a soft wrapper. Embodiments of IW-A, IW-D, and soft wrapper have been discussed with reference to FIGS. 1-4. At block 740, timing signals are provided to the IW-D for performing delay tests by strobe buses.

Figure 8:
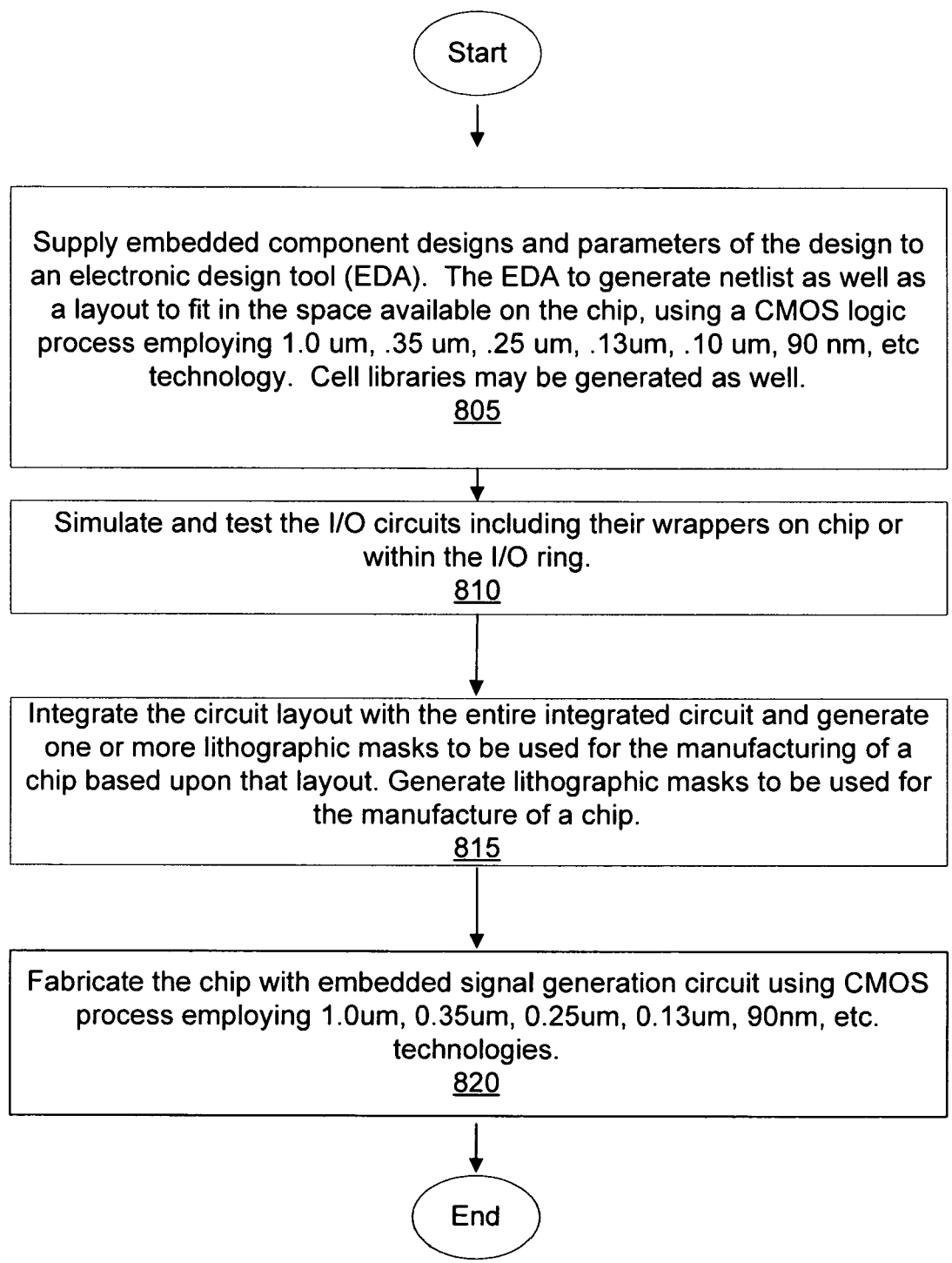
FIG. 8 illustrates a flow diagram of an embodiment of an example of a process for generating a device with a test circuit from designs of timing components.

FIG. 8 illustrates a flow diagram of an embodiment of an example of a process for generating a device with a test circuit from designs of the wrapper components. The example process for generating a device with a test circuit from designs of the wrapper components may utilize an electronic circuit design generator, such as a memory compiler, to form part of an Electronic Design Automation (EDA) toolset. The information representing the apparatuses and/or methods for the test circuit may be contained in an Instance, soft instructions in an electronic circuit design generator, or similar machine-readable storage medium storing this information. The information representing the apparatuses and/or methods stored on the machine-readable storage medium may be used in the process of creating the apparatuses and/or methods described herein.

The electronic circuit design generator may be used for making a highly configurable, scalable System On a Chip (SOC) inter-block communication system that integrally manages data, control, debug and test flows, as well as other applications. In an embodiment, an example electronic circuit design generator may comprise the following: a graphic user interface; a common set of processing elements; and a library of files containing design elements such as circuits, control logic, and cell arrays that define the electronic circuit design generator. The electronic circuit design generator may be used in designing a System on a Chip (SOC).

Traditionally, there exist two major stages of SOC design: front-end processing and back-end programming. Front-end processing comprises the design and architecture stages, which includes design of the SOC schematic. The front-end processing may include connecting models, configuration of the design, simulating and tuning during the architectural exploration. The design is typically simulated and tested. Front-end processing traditionally includes simulation of the circuits within the SOC and verification that they should work correctly. The integration of the electronic circuit design may include packing the cores, verifying the cores, simulation and debugging. The tested and verified components then may be stored as part of a library.

Back-end programming traditionally includes programming of the physical layout of the SOC such as placing and routing, or floor planning, of the circuit elements on the chip layout, as well as the routing of all interconnects between components. Thus, the floor plan may be generated imported and edited. After this, the design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist describes the connectivity of an electronic design such as the components included in the design, the attributes of each component and the interconnectivity amongst the components. After the Register Transfer Level (RTL) is generated, a Netlist may be generated. Accordingly, back-end programming further includes the physical verification of the layout to verify that it is physically manufacturable and the resulting SOC will not have any function-preventing physical defects. The front-end views support documentation, simulation, debugging, and testing. The back-end files, such as a layout, physical Library Exchange Format (LEF), etc are for layout and fabrication.

At block 805, the designs for the signal generator circuit are supplied to the electronic circuit design generator, as well as other device design parameters such as number of delay elements and MUX sizes. Thus, the designs for a device such as a signal generator circuit may be supplied to the electronic circuit design generator. As discussed, the electronic circuit design generator may be a software program comprised of multiple algorithms and designs for the purpose of generating a circuit design and a layout in a space available on a target chip. The set of application-specific algorithms and interfaces of the electronic circuit design generator may be used by system integrated circuit (IC) integrators to rapidly create a signal generation circuit suitable for the specific application. In an embodiment, this involves supplying the signal generation circuit netlist and layout fitting in a space on the chip, for example in the space equivalent to two I/Os An example electronic circuit design generator may comprise the following: a graphic user interface, a common set of processing elements, and a library of files containing design elements such as circuits, and control logic. In addition, the electronic circuit design generator may include object code in a set of executable software programs. The electronic circuit generator provides timing diagrams, power and area aspects of each component, a models coded to represent the components in order to run actual operation and configuration simulations. The electronic circuit design generator may generate a netlist and a layout targeted to fit in the space available on a target chip. Typically, the electronic circuit design generator will store the data representing the core, I/O and test circuit on a machine-readable storage medium. The electronic circuit design generator then may provide the device layout (including the test circuit) to be used to generate one or more lithographic masks utilized in the fabrication of the device including the test circuit. The electronic circuit design generator may also provide a netlist for verification of the device and test circuit.

At block 810, the generated device layout may be integrated with the rest of the layout for the chip and a machine may generate the lithographic masks that contain the information necessary for the fabrication of a functional device. In an embodiment, this involves integrating the signal generation circuit on a available space on the chip or within the I/O ring.

In block 815, the machine may generate one or more lithographic masks for transferring the circuit design onto the chip during manufacture.

In block 820, a fabrication facility may fabricate one or more chips with the signal generation circuit utilizing the lithographic masks generated from the electronic circuit design generator's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. According to one embodiment, light may pass through these lithographic masks onto the chip to transfer the circuit design and layout for the test circuit onto the chip itself. In one embodiment, the electronic circuit design generator is designed for embedded applications in a standard CMOS logic process.

In one embodiment, an electronic circuit design generator may be implemented in software as a set of instructions stored on a machine-readable medium. A machine-readable storage medium may include any mechanism that provides (e.g., stores and/or transmits) information in a form readable by a machine (e.g., a computer). For example, a machine-readable medium may include, but not be limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions. Instruction on a slower medium could be cached to a faster, more practical, medium.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is generally conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Thus it can be seen from the foregoing description that embodiments of the invention may provide an SIS architecture that includes a series of sequentially connected I/Os. Embodiments of the invention may provide off-die access to many I/Os for DC, timing, and logical test and measurements without causing on-die routing congestion or requiring significant area overhead. Furthermore, embodiments of the invention may provide access to the I/Os using merely limited number of device Pads (or pins), thereby enabling more efficient, more complete and more effective tests.

Embodiments of the invention may further reduce area overhead, improve accuracy, and minimize tester intervention significantly while exploiting (where appropriate) previously developed capabilities such as the solutions, defined by IEEE-1149.1 and IEEE-1149.4 standards. More specifically, the soft wrapper chain architecture supersets and it thus compatible with the IEEE-1149.1 boundary scan mechanism. IEEE 1149.1 boundary scan mechanism may be used for exchanging test data with each I/O by reason of its modularity and reduced routing congestion features. Thus, the boundary scan compatible feature may be designed to comply with the IEEE-1149.1 standard for enabling users to perform board level tests using the SIS soft wrapper. The specification and drawings are, accordingly, to be regarded in an illustrative rather than in a restrictive sense.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The invention is to be understood as not limited by the specific embodiments described herein, but only by scope of the appended claims.

What is claimed is:

1. An apparatus, comprising:
   a plurality of input-output circuits (I/O), wherein the plurality of I/Os are segmented together into at least a first I/O segment and a second I/O segment; and
   a first analog bus to provide external access for test purposes to two or more pins that provide PMU functionality to the first I/O segment through two or more but less than all of the I/Os within the first I/O segment.

2. The apparatus recited in claim 1, wherein the first analog bus further comprises:
   two buses carrying analog signals to the first I/O segment regardless of a number of I/O voltage domains present in the first I/O segment.

3. The apparatus recited in claim 2, wherein a first two buses carrying analog signals to the first I/O segment are not connected to a second two buses carrying analog signals to the second I/O segment.

4. The apparatus recited in claim 3, further comprising:
   a processor having logic to test the I/Os in the first I/O segment in parallel with the I/Os in the second I/O segment.

5. The apparatus recited in claim 2, wherein within each I/O segment, the two buses connect from the first I/O to the second I/O by an abutment.

6. The apparatus recited in claim 1, further comprising a first I/O wrapper, the first I/O wrapper comprising:
   an analog wrapper circuit (IW-A) to provide an access path for DC and analog test and further operable to connect one or more I/Os in the first I/O segment to analog buses and further operable to isolate one or more I/Os in the first I/O segment from the buses.

7. The apparatus recited in claim 6, wherein the first I/O wrapper further comprising an integrated wrapper for delay test circuit (IW-D) operable to launch and detect signal transitions for a delay test sequence for each I/O in the first I/O segment.

8. The apparatus recited in claim 7, the first I/O wrapper further comprising a soft wrapper circuit operable to control the IW-A and the IW-D, the soft wrapper circuit having registers configurable to provide temporary data storage units to provide temporary test data storage for each I/O.

9. The apparatus recited in claim 8, wherein the soft wrapper circuit further comprises:
a digital boundary scan module having multiple shift stages, the digital boundary scan module to exchange test data with an instruction processor of the integrated circuit, wherein the instruction processor comprises logic configured to access the first segment of I/Os and the second segment of I/Os in parallel for testing.

10. The apparatus recited in claim 7, wherein the IW-D comprises:
a calibration loop comprising a launch flip flop and a capture flip flop to test an I/O wrap path delay having a first multiplexer and a second multiplexer to switch transition paths through a first path through a first I/O and through a second path that bypasses the first I/O.

11. The apparatus recited in claim 7, wherein the IW-D uses a flip flop in toggle mode under soft wrapper control to generate launch signals in response to a first strobe and then the IW-D captures a voltage response.

12. The apparatus recited in claim 6, wherein the IW-A comprises a first switch to switch the first two analog buses to ground in the first I/O segment and a second segment of the IW-A that has a second switch to switch the second two analog buses to ground in the second I/O segment.

13. The apparatus of claim 1, wherein the first segment of I/Os is formed from a first continuous chain of I/Os, the second segment of I/Os is formed from a second continuous chain of I/Os.

14. The apparatus recited in claim 1, wherein two Parametric Test Units (PMU) to connect to each I/O segment.

15. The apparatus recited in claim 1, wherein the two or more but less than all of the I/Os used for test access are general purpose I/Os and not dedicated test pins for test purposes.

16. The apparatus recited in claim 1, further comprising:
a plurality of strobe bus conductors to provide timing signals from a strobe generation circuit to the I/Os in the first I/O segment.

17. A machine-readable medium that stores instructions, which when executed by the machine, to cause the machine to generate a representation of the apparatus of claim 1.

18. A method for testing an integrated circuit having a plurality of input/output circuits (I/Os), comprising:
segmenting I/Os into a smaller plurality of I/O segments, wherein an I/O segment is an uninterrupted chain of testable I/Os; and
providing two analog buses for each I/O segment to enable testing of I/O segments in parallel.

19. The method recited in claim 18, further comprising:
for each I/O segment, providing two I/Os within the I/O segment with access to two or more external PMUs to provide direct current test access to all I/Os in the segment using two or more I/Os, wherein the two or more I/Os used for test access are general purpose I/Os and not dedicated test pins for test purposes.

20. The method recited in claim 19, further comprising:
providing each I/O wrapper within the I/O segments with:
an analog wrapper circuit (IW-A) operable to provide an access path for DC and analog tests and further operable to connect a first I/O segment to analog buses and further operable to isolate the first I/O segment from the buses,
an integrated wrapper for delay test circuit (IW-D) operable to launch and detect transitions for a delay test sequence for each I/O in the first I/O segment, and
a soft wrapper circuit operable to control the IW-A and the IW-D.

21. The method recited in claim 18, wherein the IW-A comprises a first switch to switch the first two analog buses to ground in the first I/O segment and a second segment of the IW-A that has a second switch to switch the second two analog buses to ground in the second I/O segment.

* * * * *